United States Patent [19]

Siniscalchi et al.

[11] Patent Number: 5,528,179
[45] Date of Patent: Jun. 18, 1996

[54] CONSTANT CAPACITANCE PRGRAMMABLE TRANSCONDUCTANCE INPUT STAGE

[75] Inventors: Patrick P. Siniscalchi, Sachse; William R. Krenik, Garland, both of Tex.

[73] Assignee: Texas Instruments Incorporated, Dallas, Tex.

[21] Appl. No.: 455,815

[22] Filed: May 31, 1995

[51] Int. Cl.$^6$ ................................................ G06G 7/12
[52] U.S. Cl. .................................... 327/103; 327/560
[58] Field of Search ........................ 330/51, 252, 253; 327/65, 103, 552, 553, 557, 558, 559, 560, 561, 562, 563, 403, 407

[56] References Cited

U.S. PATENT DOCUMENTS

| | | | |
|---|---|---|---|
| 4,897,836 | 1/1990 | Fitzpatrick et al. | 327/407 |
| 5,093,634 | 3/1992 | Khoury | 330/253 |
| 5,311,088 | 5/1994 | Nelson | 327/65 |
| 5,463,349 | 10/1995 | Petersen et al. | 330/254 |

Primary Examiner—Timothy P. Callahan
Assistant Examiner—Toan Tran
Attorney, Agent, or Firm—W. James Brady, III; Richard L. Donaldson

[57] ABSTRACT

A constant capacitance programmable transconductance input stage (36) includes a first transconductance device (50), second transconductance device (52), and first switch (44) for providing a programmable input stage with a constant input capacitance. The first transconductance device (50) has two inputs and the second transconductance device (52) has two inputs. A first positive input (22) couples directly to one input of the first transconductance device (50) while a first negative input (23) couples directly to one input of the second transconductance device (52). The first positive input (22) and the first negative input (23) are switchably coupled to the remaining inputs of first transconductance device (50) and second transconductance device (52). Depending on the configuration of the first switch (44), either both transconductance devices contribute to the overall transconductance of constant capacitance programmable transconductance input stage (36) or neither does. In either event, the input capacitance remains constant.

17 Claims, 1 Drawing Sheet

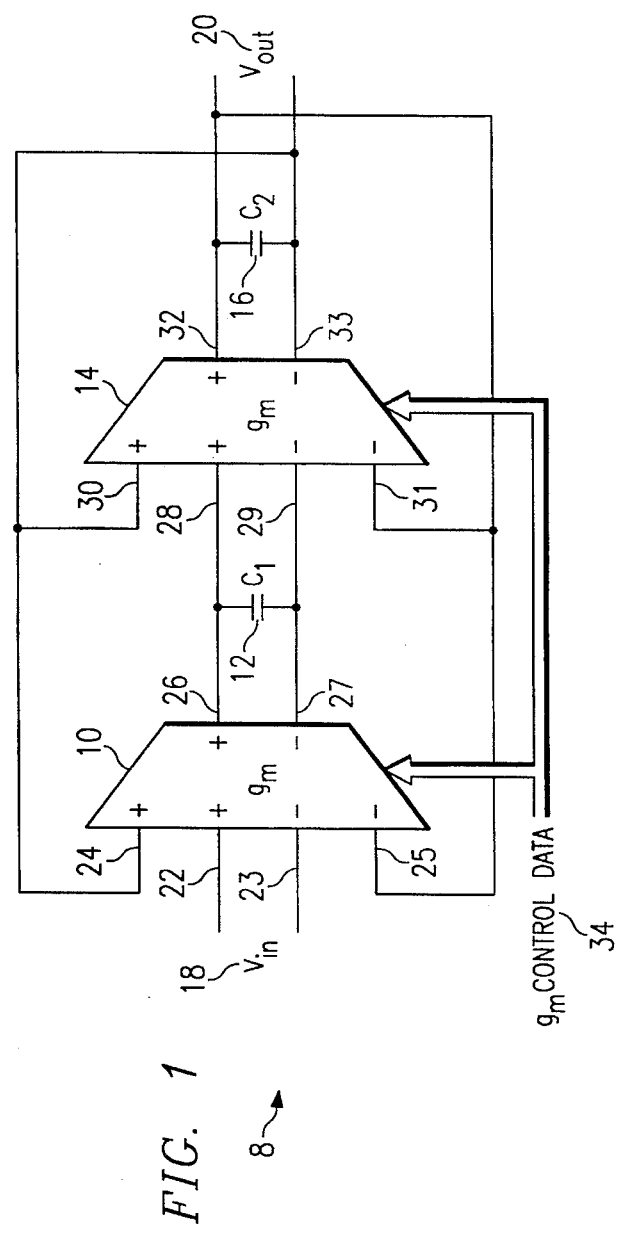
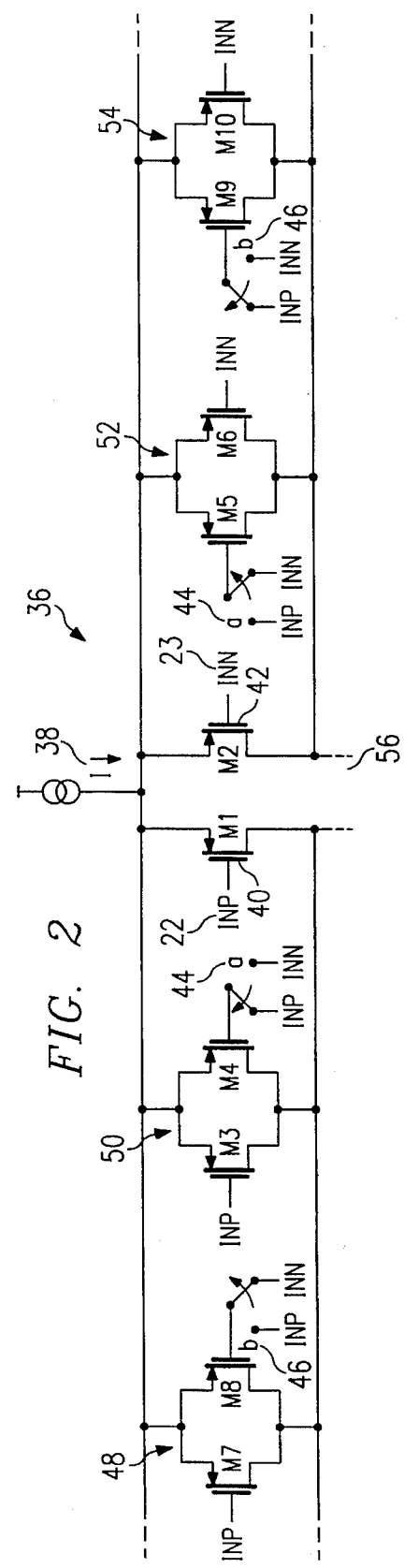
FIG. 1
FIG. 2

CONSTANT CAPACITANCE PRGRAMMABLE TRANSCONDUCTANCE INPUT STAGE

TECHNICAL FIELD OF THE INVENTION

The present invention relates in general to the field of electronics and more particularly to a constant capacitance programmable transconductance input stage.

BACKGROUND OF THE INVENTION

Electronic circuits tend to be very sensitive to parasitic capacitances, especially those using programmable transconductance input stages. For example, programmable electronic filters such as transconductance/capacitance continuous-time filters are very sensitive to parasitic capacitances. The parasitic capacitances harm the performance of the filter by moving its poles and cut-off frequency through alteration of the overall input capacitance. Additionally, the accuracy of the amplitude of the frequency-response characteristic may be altered. In cases where the parasitic capacitances do vary, the frequency-response characteristic may be significantly altered.

Programmable electronic filters such as transconductance/capacitance continuous-time programmable filters have the ability to be programmed over a range of cut-off frequencies. The programming may be achieved by switching transconductance devices in or out of the input transconductance stage, depending on the desired cut-off frequency and frequency-response characteristic. This may be done by adding transconductance devices or removing them. For example, transistors, acting as transconductance devices, may be switched in or out to alter the overall transconductance of a circuit. Unfortunately, the adding and removing of transconductance devices introduces parasitic capacitances to the input. As discussed above, parasitic capacitances may significantly degrade or alter the performance of an electronic device by changing the overall input capacitance.

An electronic filter designed to provide a frequency-response characteristic having a single cut-off frequency, may be designed to account for any known parasitic capacitances. However, programmable electronic filters have the ability to provide a range of cut-off frequencies and this programming is usually achieved by adding or removing transconductance elements or devices. Such programming changes the parasitic capacitance and prevents the design of a circuit with a known capacitance to offset a known parasitic capacitance.

SUMMARY OF THE INVENTION

From the foregoing it may be appreciated that a need has arisen for a constant capacitance transconductance input stage to ensure that the input capacitance remains constant and prevent introduction of parasitic capacitances into the input of an electronic circuit.

In accordance with the present invention, a constant capacitance programmable transconductance input stage is provided which substantially eliminates and reduces disadvantages and problems associated with filters that introduce undesirable parasitic capacitances.

According to an embodiment of the present invention, a constant capacitance input stage is provided and includes a first transconductance device, a second transconductance device, a first electrode, a second electrode, and a switch. The first transconductance device has a first input and a second input and the second transconductance device has a third input and a fourth input. The first electrode couples to the first input of the first transconductance device and switchably couples to the second input of the first transconductance device and the third input of the second transconductance device. The second electrode couples to the fourth input of the second transconductance device and switchably couples to the third input of the second transconductance device and the second input of the first transconductance device. Finally, a switch having a first and a second configuration is provided. The first configuration of the switch couples the second input of the first transconductance device to the first electrode while also coupling the third input of the second transconductance device to the second electrode. The second configuration of the switch couples the second input of the first transconductance device to the second electrode and couples the third input of the second transconductance device to the first electrode. In this manner, the input capacitance remains the same no matter how many transconductance devices are switched in and out of the circuit.

The present invention provides various technical advantages over other transconductance input stages. For example, one technical advantage includes the ability to ensure a known constant input capacitance for any combination of transconductance elements or devices. The present invention includes the ability to alter or program the overall transconductance of a circuit by switching in or out transconductance devices or elements while ensuring a constant input capacitance. The capacitance of the input stage remains constant regardless of whether a particular transconductance device's transconductance is included as part of the input stage's overall transconductance or not. Another technical advantage includes the ability to accurately provide a cut-off frequency in a programmable electronic filter. Yet another technical advantage includes improved accuracy in programmable electronic filters such as continuous-time filters. Other technical advantages of the present invention include improved accuracy for the amplitude of the frequency-response characteristic of a programmable electronic filter. Yet another technical advantage includes the ability to design an electronic circuit having a known constant input capacitance with standard transconductance devices or elements. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 is a schematic representation of a transconductance/capacitance programmable electronic filter in a biquad configuration having a constant capacitance programmable transconductance input stage; and FIG. 2 is a schematic representation of a constant capacitance programmable transconductance input stage.

DETAILED DESCRIPTION OF THE INVENTION

FIG. 1 depicts a schematic representation of a transconductance/capacitance, programmable electronic filter 8 in a biquad configuration having a constant capacitance programmable transconductance input stage. Transconductance/capacitance electronic filter 8 includes a first dual transconductance stage 10, a first load capacitor 12, a second dual transconductance stage 14, and a second load capacitor 16. First dual transconductance stage 10 and second dual transconductance stage 14 include constant capacitance programmable transconductance input stages serving as inputs to each transconductance stage.

Constant capacitance programmable transconductance input stages may be used in a variety of applications. FIG. 1 depicts the use of constant capacitance programmable transconductance input stages in a transconductance/capacitance programmable electronic filter 8 which is configured in a biquad configuration. The cut-off frequency of such a biquad filter is given by:

$$\omega_0 = \sqrt{\frac{g_m^2}{C_1 C_2}}. \quad (1)$$

First dual transconductance stage 10 provides a first input pair for one of its transconductance stages that is defined by a first positive input 22 and a first negative input 23. A second input pair of first dual transconductance stage 10 is defined by a second positive input 24 and a second negative input 25. Second dual transconductance stage 14 provides a first input pair for one of its transconductance stages that is defined by a first positive input 28 and a first negative input 29. The second input pair of second dual transconductance stage 14 is defined by a second positive input 30 and a second negative input 31. First dual transconductance stage 10 and second dual transconductance stage 14 each provide one output pair. A positive output 26 and a negative output 27 define the output pair for first dual transconductance stage 10, and a positive output 32 and a negative output 33 define the output pair of second dual transconductance stage 14.

A $V_{in}$ input voltage signal 18 is provided across first positive input 22 and first negative input 23 of first dual transconductance stage 10. Second positive input 24 of first dual transconductance stage 10 couples to second positive input 30 of second dual transconductance stage 14 and negative output 33 of second dual transconductance stage 14. Similarly, second negative input 25 of first dual transconductance stage 10 couples with second negative input 31 of second dual transconductance stage 14 and positive output 32 of second dual transconductance stage 14. As shown in FIG. 1, first load capacitor 12 couples across positive output 26 and negative output 27 of first dual transconductance stage 10, and first positive input 28 and first negative input 29 of second dual transconductance stage 14. Second load capacitor 16 couples across positive output 32 and negative output 33 of second dual transconductance stage 14. The configuration shown in FIG. 1, and described above, is that of a transconductance/capacitance programmable electronic filter in a biquad configuration.

A constant capacitance programmable transconductance input stage is provided as an input stage to each of the transconductance stages provided by first dual transconductance stage 10 and second dual transconductance stage 14. The inputs to these four transconductance stages are defined by first positive input 22 and first negative input 23, second positive input 24, and second negative input 25 of first dual transconductance stage 10, and first positive input 28, first negative input 29, second positive input 30 and second negative input 31 of second dual transconductance stage 14.

In operation, first dual transconductance stage 10 receives input voltage across first positive input 22 and first negative input 23. Input voltage $V_{in}$ is provided as a differential signal that is to be filtered by transconductance/capacitance programmable electronic filter 8. The filtered output voltage signal corresponding to input voltage signal 18 is shown in FIG. 1 as output voltage signal 20. Output voltage signal 20 is provided as a differential output signal.

First dual transconductance stage 10 and second dual transconductance stage 14 both receive transconductance control data 34. Transconductance control data 34 corresponds to the programming of first dual transconductance stage 10 and second dual transconductance stage 14. A transconductance stage may be programmed to correspond to the desired overall transconductance of a particular transconductance stage. For example, transconductance control data 34 may be received by first dual transconductance stage 10 and provide information concerning which transconductance devices, within first dual transconductance stage 10, should be switched in or switched out so that the overall desired transconductance of first dual transconductance stage 10 will be achieved. Any electronic device or other device that provides a known conductance may serve as a transconductor device. The transconductance control data 34 being received by second dual transconductance stage 14 provides information to achieve the desired overall transconductance of second dual transconductance stage 14. Transconductance control data 34 may be provided as a digital word in digital format.

First dual transconductance stage 10 receives voltage input signal 18. First dual transconductance stage 10 provides a desired transconductance as selected through transconductance control data 34. First load capacitor 12 then provides a desired capacitance across the output of first dual transconductance stage 14 defined by positive output 26 and negative output 27. A signal is then provided across the first input pair of second dual transconductance stage 14 as defined by first positive input 28 and first negative input 29. Second dual transconductance stage 14 then provides a desired transconductance as established by transconductance control data 34. Second load capacitor 16 is coupled across the output of second dual transconductance stage 14, as defined by positive output 32 and negative output 33, to provide a desired capacitance. Output voltage signal 20 is defined across second load capacitor 16.

The circuit configuration, as shown in FIG. 1, provides the desired frequency-response characteristic for a second-order biquadratic or biquad, filter. This circuit configuration requires feedback. Negative output 33 couples to second positive input 30 of second dual transconductance stage 14 and second positive input 24 of first dual transconductance stage 10. Positive output 32 couples to second negative input 31 of second dual transconductance stage 14 and second negative input 25 of first dual transconductance stage 10.

The cut-off frequency of the transconductance/capacitance programmable electronic filter 8 may provide an accurate frequency-response characteristic over a desired range of cut-off frequencies. The present invention, as more fully shown in FIG. 2, provides a constant input capacitance, even as first dual transconductance stage 10 and second dual transconductance stage 14 provide a range of transconductance values for various cut-off frequencies. The fact that the input parasitic capacitance remains constant allows for first load capacitor 12 and second load capacitor 16 to remain constant.

FIG. 2 depicts a schematic representation of an embodiment of a constant capacitance programmable transconductance input stage 36. Constant capacitance programmable transconductance input stage 36 includes a first transconductance device 50, a second transconductance device 52, a third transconductance device 48, a fourth transconductance device 54, a fifth transconductance device 40, a sixth transconductance device 42, a first switch 44, and a second switch 46. A bias current 38 is also provided to bias the transistors. The output of constant capacitance programmable transconductance input stage 36 is shown in FIG. 2 by an output 56.

First transconductance device 50, second transconductance device 52, third transconductance device 48, and fourth transconductance device 54 are all configured as a transistor pair in which the drains of two MOSFET transistors are coupled. All of these transconductance devices have two inputs. The gates of each transistor pair serve as the inputs to each of these transconductance devices. One gate is coupled directly to either first positive input 22 or first negative input 23. The other input, or transistor gate, is switchably coupled to first positive input 22 and first negative input 23. Fifth transconductance device 40 and sixth transconductance device 42 both include only one transistor. First positive input 22 couples to the gate of fifth transconductance device 40, and first negative input 23 couples to the gate of sixth transconductance device 42. Fifth transconductance device 40 and sixth transconductance device 42 contribute to the overall transconductance of constant capacitance programmable transconductance input stage 36.

First positive input 22 and first negative input 23 are shown in FIG. 2 as INP and INN, respectively. These inputs may be any of the four input pairs shown in FIG. 1. INP first positive input 22 couples directly to the following: the gate of transistor M1 of fifth transconductance device 40, the gate of transistor M3 of first transconductance device 50, and the gate of transistor M7 of third transconductance device 48. INP first positive input 22 switchably couples between first switch 44 and the gate of transistor M4 of first transconductance device 50 and the gate of transistor M5 of second transconductance device 52. INP first positive input 22 also switchably couples between second switch 46 and the gate of transistor M9 of fourth transconductance device 54 and the gate of transistor M8 of third transconductance device 48.

INN first negative input 23 couples directly to the following: the gate of transistor M2 of sixth transconductance device 42, the gate of transistor M6 of second transconductance device 52, and the gate of transistor M10 of fourth transconductance device 54. INN first negative input 23 switchably couples between first switch 44 and the gate of transistor M4 of first transconductance device 50 and the gate of transistor M5 of second transconductance device 52. INN first negative input 23 also switchably couples between second switch 46 and the gate of transistor M9 of fourth transconductance device 54 and the gate of transistor M8 of third transconductance device 48.

First switch 44 and second switch 46 may each be configured in a first configuration or a second configuration. For example, first switch 44 may be configured such that INP first positive input 22 couples to the gate of transistor M4 of first transconductance device 50 and INN first negative input 23 couples to transistor M5 of second transconductance device 52. When first switch 44 is configured in this first configuration, first transconductance device 50 and second transconductance device 52 contribute to the overall transconductance of constant capacitance programmable transconductance input stage 36.

First switch 44 may be configured in an alternative configuration such that INN first negative input 23 couples to the gate of transistor M4 of first transconductance device 50 while INP first positive input 22 couples to the gate of transistor M5 of second transconductance device 52. This second configuration of first switch 44 cancels any contribution from first transconductance device 50 and second transconductance device 52.

Similarly, second switch 46 provides two configurations. The first configuration, shown in FIG. 2, provides a coupling between INN first negative input 23 and the gate of transistor M8 of third transconductance device 48 while INP first positive input 22 couples to the gate of transistor M9 of fourth transconductance device 54. This first configuration of second switch 46 cancels any contribution by third transconductance device 48 and fourth transconductance device 54 to the overall transconductance of constant capacitance programmable transconductance input stage 36.

Another configuration of second switch 46 provides a coupling between INP first positive input 22 and the gate of transistor M8 of third transconductance device 48 while INN first negative input 23 couples to the gate of transistor M9 of fourth transconductance device 54. This second configuration ensures that third transconductance device 48 and fourth transconductance device 54 contribute to the overall transconductance of constant capacitance programmable transconductance input stage 36.

In operation, first switch 44 and second switch 46 may receive an input switch configuration signal, a and b respectively, corresponding to a desired transconductance. This signal determines the configuration of first switch 44 and second switch 46. First transconductance device 50, second transconductance device 52, third transconductance device 48, and fourth transconductance device 54 serve as transconductance devices or elements that may contribute to the overall transconductance of constant capacitance programmable transconductance input stage 36 depending on the configuration of first switch 44 and second switch 46. Fifth transconductance device 40 and sixth transconductance device 42 are not coupled to first switch 44 or second switch 46 and hence contribute to the overall transconductance of constant capacitance programmable transconductance input stage 36.

First transconductance device 50, second transconductance device 52, third transconductance device 48, and fourth transconductance device 54, as depicted in FIG. 2, are all configured as a transistor pair in which the drains of two transistors are coupled. The gates or inputs of each of these transconductance devices may be switchably coupled to the same signal or to a differential signal. For example, first transconductance device 50 provides transistor M3 and transistor M4 in which the drains are coupled. The gates of transistors M3 and M4 of first transconductance device 50 are also coupled to INP first positive input 22. In this first configuration of first switch 44, first transconductance device 50 contributes to the overall transconductance of constant capacitance programmable transconductance input stage 36. However, to eliminate the contribution of first transconductance device 50 to the overall transconductance, first switch 44 may be configured so that the gate of transistor M4 couples to INN first negative input 23, which cancels the transconductance contribution of first transconductance device 50. This can be achieved because INP first positive input 22 and INN first negative input 23 are differential signals and hence transistors M3 and M4 of first transconductance device 50 cancel each others transconductance. Second transconductance device 52, third transconductance device 48, and fourth transconductance device 54 all provide a pair of transistors configured as just described for first transconductance device 50.

First transconductance device 50 and second transconductance device 52 both contain transistors which are switchably coupled through first switch 44. First switch 44 may be configured in one of two configurations. When first switch 44 couples INN first negative input 23 to the gate of transistor M4 of first transconductance device 50, simultaneously, first switch 44 couples the gate of transistor M5 of second transconductance device 52 to INP first positive input 22. Hence, in this second configuration of first switch 44, neither first transconductance device 50 nor second transconductance device 52 contribute to the overall transconductance of constant capacitance programmable transconductance input stage 36. However, when first switch 44 is configured in its first configuration, as shown in FIG. 2, both first transconductance device 50 and second transconductance device 52 contribute to the overall transconductance of constant capacitance programmable transconductance input stage 36.

The number of transconductance devices coupled to both INP first positive input 22 and INN first negative input 23 remains constant regardless of the configuration of first switch 44. The relationship between second switch 46 and third transconductance device 48 and fourth transconductance device 54 is the same as just described for first switch 44 and first transconductance device 50 and second transconductance device 52. Thus it can be seen that for any combination of first switch 44 and second switch 46, the number of transconductance devices coupled to either first positive input 22 or first negative input 23 remains constant. The fact that the number of transconductance devices remains constant ensures that the input capacitance also remains constant. In the embodiment shown in FIG. 2, both first positive input 22 and first negative input 23 are always coupled to an equal number of transistors within constant capacitance programmable transconductance input stage 36.

First switch 44 and second switch 46 may be an electronic switch. An electronic switch may be any electronic device that is used as a switch. For example, first switch 44 and second switch 46 may be implemented as a MOSFET or as a CMOS transmission gate. A MOSFET refers to a metal oxide silicon field-effect transistor which may have either an n-channel or a p-channel. CMOS refers to complementary metal oxide silicon in which MOSFETs of both types are used.

In summary, the present invention provides a constant capacitance programmable transconductance input stage that ensures a constant input capacitance for any combination of transconductance elements or devices. As explained above, the input capacitance remains constant regardless of the programming of the transconductance elements or whether or not a transconductance element or device is included as part of the input stage's overall conductance. The present invention may be used in a programmable electronic filter to ensure accurate cut-off frequencies and to improve the accuracy of its frequency-response characteristic. The fact that the input capacitance remains constant allows an electronic circuit to be designed with a known constant input capacitance. Because the input capacitance remains constant, circuits may be designed using standard transconductance devices or elements. The present invention takes advantage of a differential signal to ensure a constant input capacitance.

Thus, there has been provided, in accordance with the present invention, a constant capacitance programmable transconductance input stage that satisfies the advantages as set forth above. Although the present invention and its advantages have been described in detail, it should be understood that various changes, substitutions and alterations can be made therein. For example, the present invention could be used in a voltage controlled oscillator using transconductance/capacitance integrators so that the center frequency may be accurately programmable. Additionally, connections other than those shown may be used in order to provide similar transconductance programming while maintaining constant input capacitance. Other examples are readily ascertainable to one skilled in the art and may be made without departing from the spirit and scope of the invention as defined by the appended claims.

What is claimed is:

1. A constant capacitance input stage comprising:
   a first transconductance device having a first input, a second input, and a first output, said first input operable to receive a first signal;
   a second transconductance device having a third input, a fourth input, and a second output, the fourth input operable to receive a second signal; and
   a switch having a first and a second configuration, the first configuration couples the second input of the first transconductance device, to the first signal, and couples the third input of the second transconductance device to the second signal, the second configuration couples the second input of the first transconductance device to the second signal, and couples the third input of the second transconductance device to the first signal, such that an input capacitance remains constant when the switch is positioned in either the first or second configuration.

2. The constant capacitance input stage of claim 1, wherein the first transconductance device includes a pair of transconductance elements having the first input and the second input, and the second transconductance device includes a pair of transconductance elements having the third input and the fourth input.

3. The constant capacitance input stage of claim 2, wherein the transconductance elements of the first and second transconductance devices include transistors.

4. The constant capacitance input stage of claim 1 further comprising:
   a third transconductance device having an input coupled to the first signal and an output coupled to the first output; and
   a fourth transconductance device having an input coupled to the second signal and an output coupled to the second output.

5. The constant capacitance input stage of claim 1, wherein the first and second transconductance devices include MOSFET transistors.

6. The constant capacitance input stage of claim 1, wherein the switch is operable to receive a switching signal for switching from the first configuration to the second configuration.

7. The constant capacitance input stage of claim 1, wherein the switch includes an electronic switch.

8. The constant capacitance input stage of claim 7, wherein the electronic switch includes a transistor operable to perform switching.

9. The constant capacitance input stage of claim 7, wherein the electronic switch includes a CMOS transmission gate operable to perform switching.

10. A constant capacitance input stage comprising:
    a first transconductance device having a first input, a second input, and a first output, the first input receiving a first signal;
    a second transconductance device having a third input, a fourth input, and a second output, the fourth input receiving a second signal;

a third transconductance device having a fifth input, a sixth input, and a third output coupled to the first output, the fifth input receiving a second signal;

a fourth transconductance device having a seventh input, an eighth input, and a fourth output coupled to the second output, the eighth input receiving the second signal;

a first switch having a first and a second configuration, the first configuration of the first switch couples the second input of the first transconductance device to the first signal, and couples the third input of the second transconductance device to the second signal, the second configuration of the first switch couples the second input of the first transconductance device to the second signal, and couples the third input of the second transconductance device to the first signal, such that an input capacitance remains constant when the first switch is positioned in either the first or second configuration; and a second switch having a first and second configuration, the first configuration of the second switch couples the sixth input of the third transconductance device to the first signal, and couples the seventh input of the fourth transconductance device to the second signal, the second configuration of the second switch couples the sixth input of the third transconductance device to the second signal, and couples the seventh input of the fourth transconductance device to the first signal, such that an input capacitance remains constant when the second switch is positioned in either the first or second configuration.

11. The constant capacitance input stage of claim 10, wherein the first transconductance device includes a pair of transconductance elements having the first input and the second input, the second transconductance device includes a pair of transconductance elements having the third input and the fourth input, the third transconductance device includes a pair of transconductance elements having the fifth input and the sixth input, and the fourth transconductance device includes a pair of transconductance elements having the seventh input and the eighth input.

12. The constant capacitance input stage of claim 11, wherein the transconductance elements of the first, second, third and fourth transconductance devices include transistors.

13. The constant capacitance input stage of claim 10 further comprising:

a fifth transconductance device having an input coupled to the first signal and an output coupled to the first output; and a sixth transconductance device having an input coupled to the second signal and an output coupled to the second output.

14. The constant capacitance input stage of claim 10, wherein the first, second, third, and fourth transconductance devices include MOSFET transistors.

15. The constant capacitance input stage of claim 14, wherein the first signal and the second signal are coupled to an equal number of transistors.

16. The constant capacitance input stage of claim 10, wherein the first and second switch are operable to receive a switching signal for switching from the first configuration to the second configuration respectively.

17. The constant capacitance input stage of claim 10, wherein each of the first and second switches include an electronic switch.

* * * * *